United States Patent
Standing

(10) Patent No.: US 7,368,325 B2
(45) Date of Patent: May 6, 2008

(54) SEMICONDUCTOR PACKAGE

(75) Inventor: Martin Standing, Kent (GB)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/799,140

(22) Filed: May 1, 2007

(65) Prior Publication Data

US 2007/0202631 A1    Aug. 30, 2007

Related U.S. Application Data

(62) Division of application No. 11/405,825, filed on Apr. 18, 2006, now Pat. No. 7,230,333.

(60) Provisional application No. 60/674,162, filed on Apr. 21, 2005.

(51) Int. Cl.
H01L 21/44 (2006.01)
H01L 21/48 (2006.01)
H01L 21/50 (2006.01)

(52) U.S. Cl. ............ 438/121; 438/107; 438/611; 257/E23.183

(58) Field of Classification Search ........ 438/121, 438/107, 611; 257/E23.183
See application file for complete search history.

(56) References Cited

U.S. PATENT DOCUMENTS

| | | |
|---|---|---|
| 3,561,107 A | 2/1971 | Best et al. |
| 3,871,014 A | 3/1975 | King et al. |
| 3,972,062 A | 7/1976 | Hopp |
| 4,021,838 A | 5/1977 | Warwick |
| 4,604,644 A | 8/1986 | Beckham et al. |
| 5,182,632 A | 1/1993 | Bechtel et al. |
| 5,217,922 A | 6/1993 | Akasaki et al. |
| 5,311,402 A | 5/1994 | Kobayashi et al. |
| 5,313,366 A | 5/1994 | Gaudenzi et al. |
| 5,367,435 A | 11/1994 | Andros et al. |
| 5,371,404 A | 12/1994 | Juskey et al. |
| 5,381,039 A | 1/1995 | Morrison |
| 5,394,490 A | 2/1995 | Kato et al. |
| 5,397,921 A | 3/1995 | Karnezos |
| 5,447,886 A | 9/1995 | Rai |
| 5,448,114 A | 9/1995 | Kondoh et al. |
| 5,454,160 A | 10/1995 | Nickel |
| 5,477,087 A | 12/1995 | Kawakita et al. |
| 5,510,758 A | 4/1996 | Fujita et al. |
| 5,512,786 A | 4/1996 | Imamura et al. |
| 5,532,512 A | 7/1996 | Fillion et al. |
| 5,554,887 A | 9/1996 | Sawai et al. |

(Continued)

FOREIGN PATENT DOCUMENTS

JP    5-129516    5/1993

(Continued)

OTHER PUBLICATIONS

Mosfet BGA Design Guide 2004, Fairchild Semiconductor.

*Primary Examiner*—Nitin Parekh
(74) *Attorney, Agent, or Firm*—Ostrolenk, Faber, Gerb & Soffen, LLP

(57) ABSTRACT

A semiconductor package that includes a conductive can, a power semiconductor device electrically and mechanically attached to the inside surface of the can, and an IC semiconductor device copackaged with the power semiconductor device inside the can.

12 Claims, 4 Drawing Sheets

U.S. PATENT DOCUMENTS

| | | | |
|---|---|---|---|
| 5,578,869 | A | 11/1996 | Hoffman et al. |
| 5,654,590 | A | 8/1997 | Kuramochi |
| 5,703,399 | A * | 12/1997 | Majumdar et al. .......... 257/723 |
| 5,703,405 | A | 12/1997 | Zeber |
| 5,726,489 | A | 3/1998 | Matsuda et al. |
| 5,726,501 | A | 3/1998 | Matsubara |
| 5,726,502 | A | 3/1998 | Beddingfield |
| 5,729,440 | A | 3/1998 | Jimarez et al. |
| 5,734,201 | A | 3/1998 | Djennas et al. |
| 5,739,585 | A | 4/1998 | Akram et al. |
| 5,814,894 | A | 9/1998 | Igarashi et al. |
| 5,821,161 | A * | 10/1998 | Covell et al. ............... 438/613 |
| 6,133,634 | A | 10/2000 | Joshi |
| 6,303,974 | B1 | 10/2001 | Irons et al. |
| 6,391,687 | B1 | 5/2002 | Cabahug et al. |
| 6,720,647 | B2 | 4/2004 | Fukuizumi |
| 6,723,582 | B2 * | 4/2004 | Glenn et al. ................. 438/107 |
| 6,744,124 | B1 | 6/2004 | Chang et al. |
| 7,227,259 | B2 * | 6/2007 | Heilbronner et al. ....... 257/724 |
| 2005/0104176 | A1 * | 5/2005 | Rodney et al. ............. 257/678 |
| 2006/0226451 | A1 * | 10/2006 | Davies ....................... 257/210 |

FOREIGN PATENT DOCUMENTS

| | | |
|---|---|---|
| JP | 07-202064 | 4/1995 |
| JP | 11-054673 | 2/1999 |
| JP | 2000-243887 | 8/2000 |

* cited by examiner

SEMICONDUCTOR PACKAGE

RELATED APPLICATION

This application is a division of U.S. application Ser. No. 11/405,825, filed Apr. 18, 2006 now U.S. Pat. No. 7,230,333, entitled Semiconductor Package which is based on and claims benefit of U.S. Provisional Application No. 60/674,162, filed on Apr. 21, 2005, entitled Semiconductor Package, to which a claim of priority is hereby made and the disclosure of which is incorporated by reference.

BACKGROUND OF THE INVENTION

The present invention relates to semiconductor packages.

In the recent years, chip-scale packages have become very important. The present invention relates to power semiconductor packages and methods of manufacturing power semiconductor packages.

Referring to FIGS. 1-4, a package 10 according to the prior art includes a conductive can 12, and a power semiconductor die 14. Can 12 is typically formed with an electrically conductive material such as copper or a copper-based alloy, and may be coated with silver, gold or the like. Die 14 may be a vertical conduction type power semiconductor MOSFET having its drain electrode 16 electrically and mechanically attached to an interior surface of can 12 by a conductive adhesive 18 such as solder or a conductive epoxy (e.g. silver epoxy). Source electrode 20, and gate electrode 22 of die 14 (which are disposed on a surface opposite to the drain electrode) each includes a solderable body which facilitates its direct connection to a respective conductive pad 24, 26 of a circuit board 28 by a conductive adhesive (e.g. solder or conductive epoxy) as illustrated by FIG. 4. Note that die 14 further includes passivation body 30 which partially covers source electrode 20 and gate electrode 22, but includes openings to allow access at least to the solderable portions thereof for electrical connection. Further note that in package 10 conductive can 12 includes web portion 13 (to which die 14 is electrically and mechanically connected), wall 15 surrounding web portion 13, and two oppositely disposed rails 32 extending from wall 15 each configured for connection to a respective conductive pad 34 on circuit board 28. Also, note that die 14 is spaced from wall 13 of can 12; i.e. wall 13 surrounds die 14. Thus, a moat 36 is present between die 14 and wall 13.

In a package according to the prior art, source electrode 20, and gate electrode 22 are soldered down by the user. Specifically, the user applies solder to, for example, the pads of a circuit board, and the electrodes of the die are attached to the pads by the solder so placed.

A package as described above is disclosed in U.S. Pat. No. 6,624,522.

DESCRIPTION OF PROCESS FOR FABRICATING DEVICE

In some applications it is desirable to co-package two or more die in the same package. For example, it is desirable to co-package a power semiconductor die such as a power MOSFET with an IC die or the like for driving the die.

A semiconductor package according to the present invention includes a can-shaped conductive clip having an interior surface, a dielectric body disposed over at least a portion of the interior surface of the conductive clip, at least one I/O terminal, a conductive pad, a track connecting the pad to the I/O terminal, an IC having at least one pad electrically connected to the die pad, and a power semiconductor device having at least one power electrode electrically and mechanically connected to another portion of the interior surface of the conductive clip.

In a package according to the preferred embodiment of the present invention the clip is configured to receive a power MOSFET with an IC die for driving the power die.

Other features and advantages of the present invention will become apparent from the following description of the invention which refers to the accompanying drawings.

DETAILED DESCRIPTION OF EMBODIMENT

Figure 1:
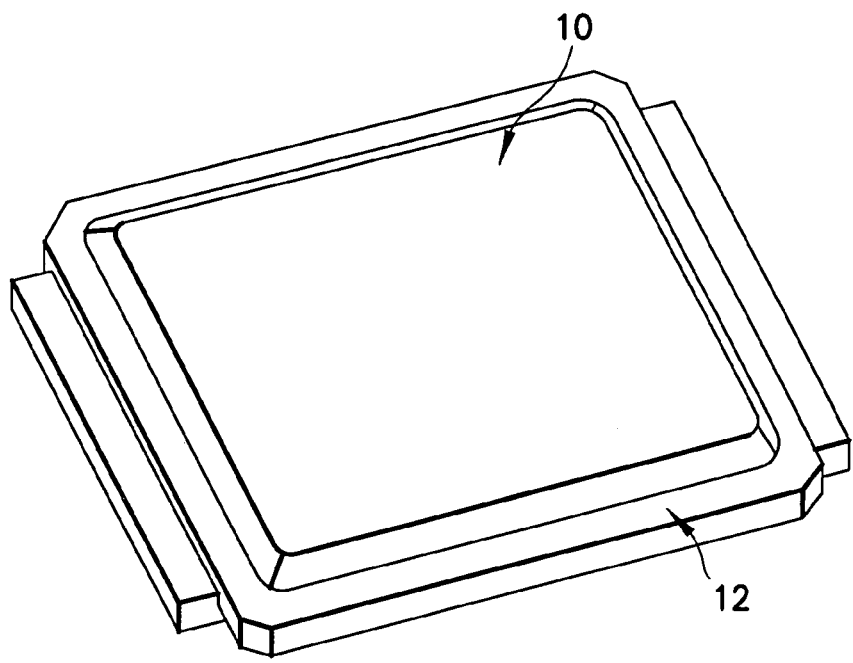
FIG. 1 is a perspective view of a package according to prior art.
Figure 2:
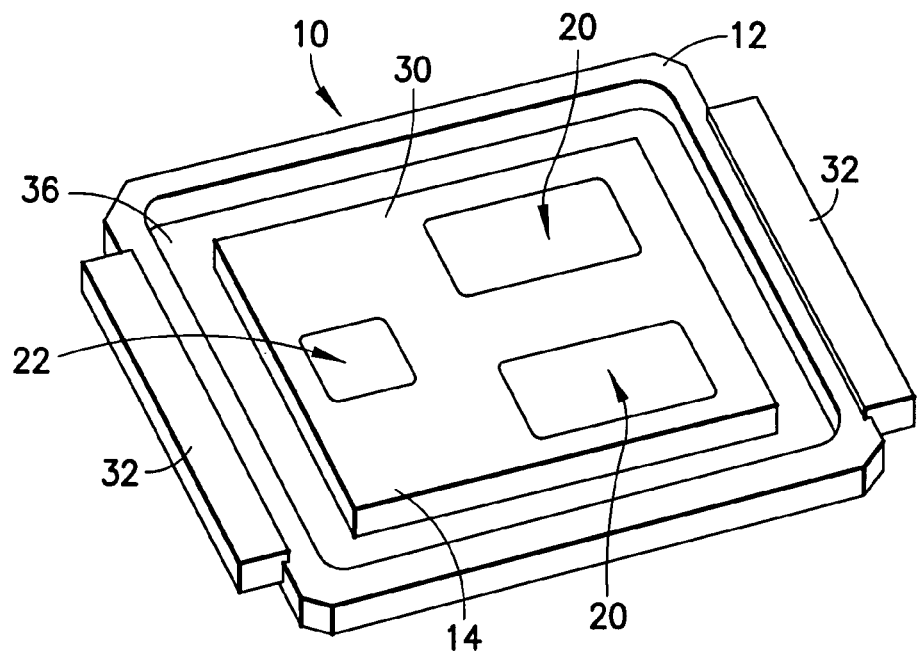
FIG. 2 is another perspective view of the package of FIG. 1.
Figure 3:
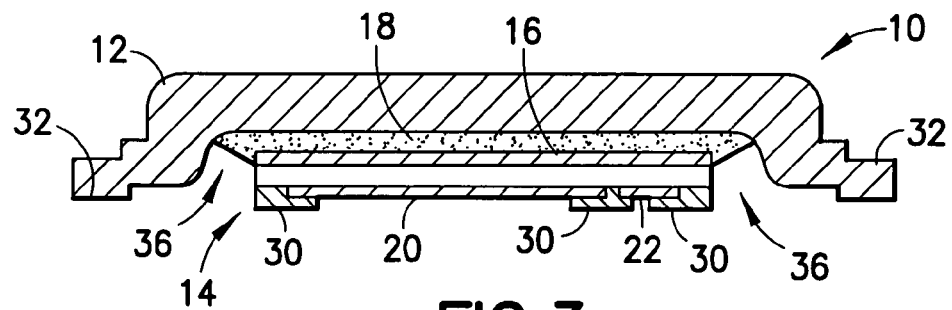
FIG. 3 is a cross-sectional view of the package of FIG. 1 along line 3-3 in FIG. 2.
Figure 4:
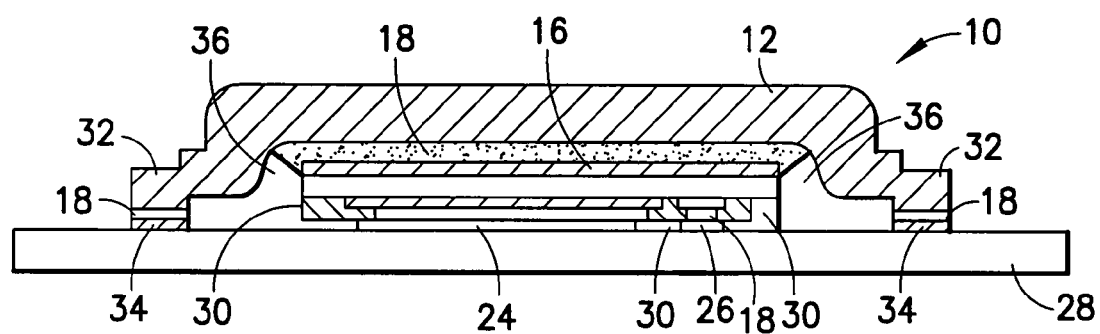
FIG. 4 shows the package of FIG. 1 as assembled on a circuit board.
Figure 5:
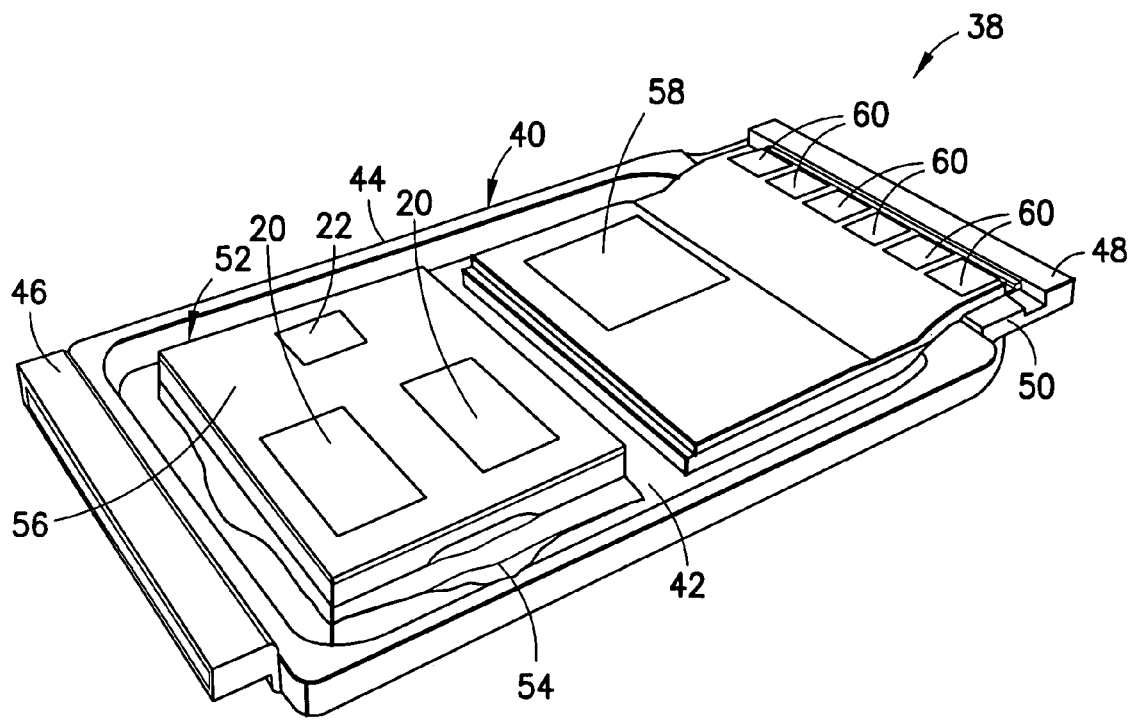
FIG. 5 shows a perspective bottom view of a package according to the present invention.

Referring next to FIG. 5, a package 38 according to the preferred embodiment of the present invention includes conductive can 40, which includes a web portion 42, a wall 44 surrounding web portion 42, a first rail 46 disposed at one side of wall 44, and second rail 48 disposed at a second side of wall 44 opposite the first side. Note that according to one aspect of the present invention second rail 48 is spaced laterally further away than first wall 46 by a lateral lip portion 50. Conductive can 48 is preferably made from copper or a copper alloy, and may be coated with silver, gold or the like. Package 38 further includes a power semiconductor device 52. Power semiconductor device is preferably a power MOSFET that includes identical or similar features as die 14 in a semiconductor package; however, device 52 may also be an IGBT or the like. Specifically, device 52 includes source electrode 20, a gate electrode 22 on one surface thereof, and drain electrode (not shown) on an opposite surface thereof electrically and mechanically connected to web portion 42 by a conductive adhesive 54. Note that similar to die 14, a passivation body 56 is disposed on a surface of device 52 and surrounds source electrode 20, and gate electrode 22 in the same manner as described above with reference to the prior art. Note that source electrode 20, and gate electrode 22 may be rendered solderable for direct connection with a conductive adhesive or the like to a conductive pad of, for example, a circuit board.

Package 38 further includes an integrated circuit semiconductor device (IC) 58. In the preferred embodiment, IC 58 includes a driver circuit that is capable of driving power MOSFET 52. IC 58 is electrically connected to a plurality of input/output terminals (I/O) terminals 60. I/O terminals 60 reside over an insulation body disposed on lip portion 50. The purpose of I/O terminals 60 is to transmit input signals to IC 58, and receive output signals from IC 58. Note that preferably I/O terminals 60 are coplanar with first and second tracks 46, 48. As a result, when assembled, I/O terminals 60 may be electrically and mechanically connected to corresponding pads on a circuit board (e.g. by a conductive adhesive such as solder or conductive epoxy) that are coplanar with and adjacent to a pad designated for receiving second rail 48.

Figure 6:
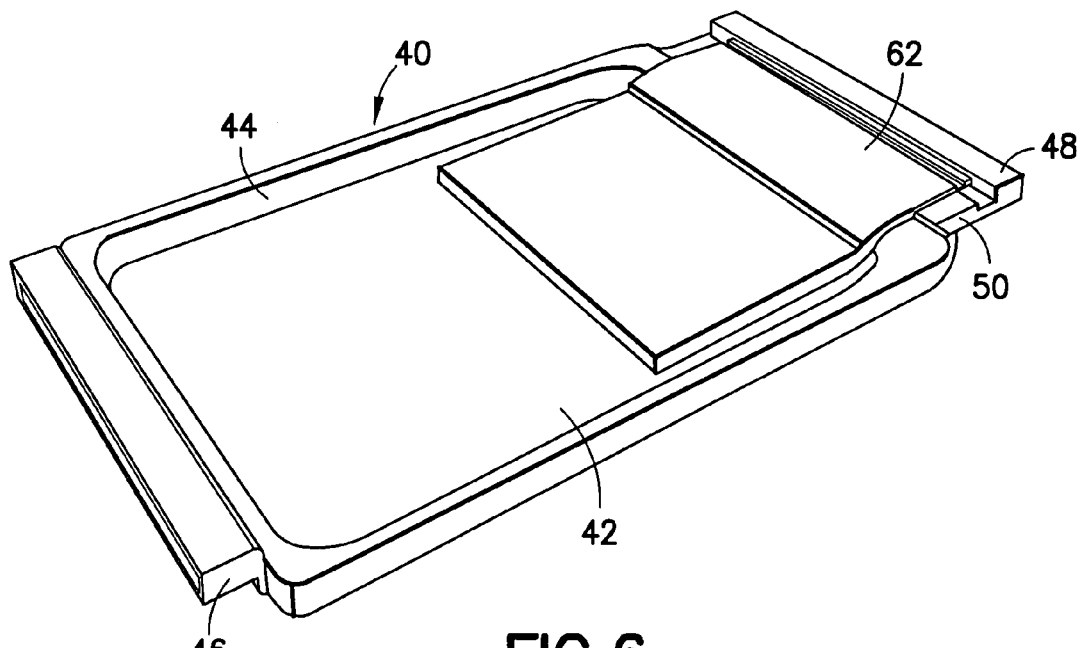
FIGS. 6-8 illustrate selected steps in the fabrication of a package according to the present invention.
Figure 7:
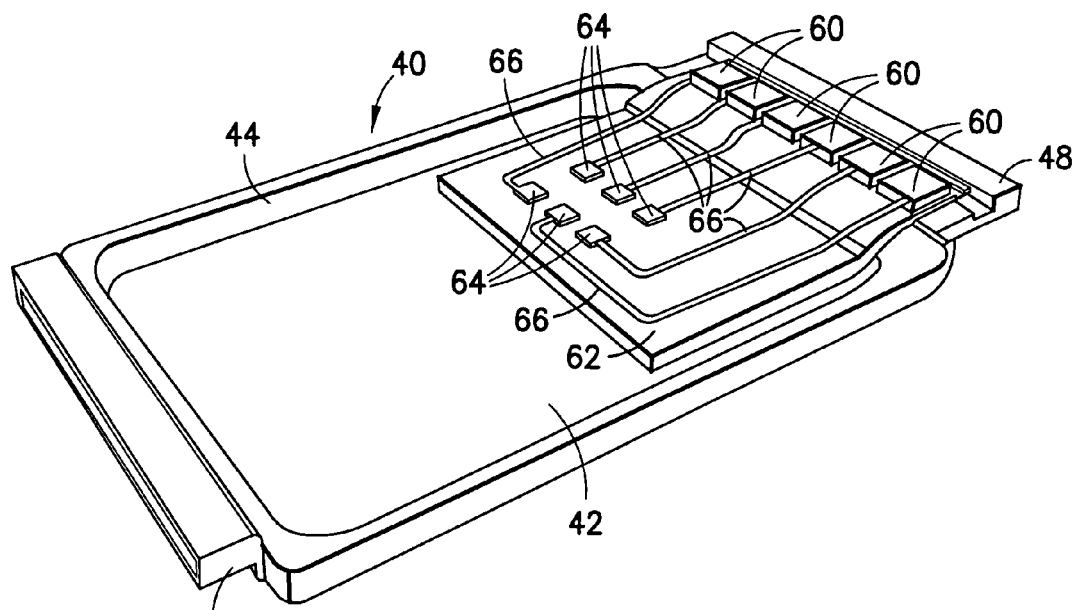
Figure 8:
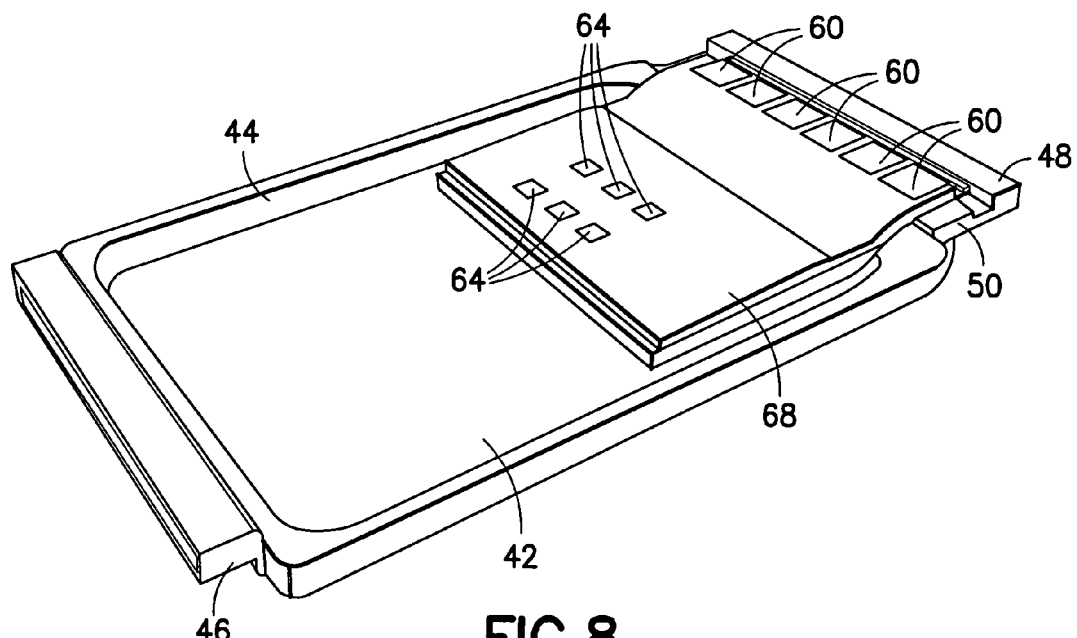

Referring next to FIGS. 6-8, to fabricate package 38 first a dielectric body 62 is deposited on a portion of web portion 42 extending along a portion of wall 44 and lip 50. Dielectric body 62 is preferably made from a polymer-based material, and can be deposited through stenciling, drop-on-demand deposition, or any other suitable method. Drop-on-demand deposition is disclosed in U.S. patent application Ser. No. 11/367,725, assigned to the assignee of the present invention, and incorporated herein by this reference. Drop-on-demand deposition is a preferred method for the advantages set forth in U.S. patent application Ser. No. 11/367,725.

Dielectrics capable of the isolation desired for a package according to the present invention have been used in the production of plasma panel displays. Such dielectric materials include dielectric particles loaded in an organic base, which may be any of the following depending upon the application requirements: epoxy, acrylic based (acrylate), polyimide or organopolysiloxane. UV curing materials are preferred to reduce the process time, although other materials such as thermally curable materials may be used without deviating from the present invention. The dielectric material would be typically a metal oxide such as alumina or aluminum nitride. Preferably, the dielectric material has a low and very controlled particle size to allow for drop-on-demand deposition.

Referring next to FIG. 7, a plurality of conductive input/output leads (I/O leads) are formed on dielectric body 62. Each I/O lead includes a conductive pad 64 which is electrically connected to a respective I/O terminal 60 via a respective conductive track 66. I/O leads can also be formed through any printing method such as stenciling, or deposition method such as drop-on-demand deposition. In one alternative embodiment, an organic based trace layer can be first deposited and cured. The cured trace will then form a seed layer for the construction of I/O pads 64, tracks, and I/O terminals 60.

The material used for forming I/O leads and I/O terminals 60 may be a polymer that is impregnated with micronized, highly conductive particles. The dispersion of micronized, highly conductive particles within a polymer matrix can allow for relatively low resistance I/O leads and I/O terminals suitable for carrying signals to and from IC 58.

The conductive materials suitable for a package according to the present invention should be very similar in formulation to the dielectrics regarding the base materials. The conductive micronized fillers tend to be materials that are both highly conductive and have low tendencies to oxidize. Typical materials deemed suitable include gold, silver, platinum, rhodium etc., or combinations thereof.

Alternatively, the conductive material may be a mixture of reflowing (solders) and non-reflowing (metal particles) mixed in with a fluid to form a slurry, which is then printed to form a reflowable, fusible material, similar to the solder paste referred to above and disclosed in U.S. patent application Ser. No. 11/367,725. The alternative conductive material may increase the choices of metals, as the fluid used for the slurry could be used to reduce or protect the metals from oxidation.

Referring next to FIG. 8, a protective body 68 is deposited over at least conductive tracks 66. Note that pads 64, and terminals 60 remain exposed. Protective body 68 may be a solder resist material; i.e. a material that is unwettable by liquid solder, and may serve as a passivation. Preferably, protective body 68 is polymer-based. Protective body 68 may be printed using any known method such a stenciling, or deposited using drop-on-demand deposition.

Thereafter, a thick layer of conductive adhesive material is printed onto I/O pads 64 to be used as a die-bonding medium for IC 58. At the same time a highly solvent thinned, low resin loaded slurry material is printed onto the I/O terminals 60. The slurry material acts as a base layer for tinning or possible plating.

Next, device 52 and IC 58 are installed. Specifically, with a conductive adhesive the drain electrode of device 52 is electrically and mechanically connected to web portion 42 of can 40, and the electrodes (not shown) of IC 58 are electrically and mechanically connected to pads 64 using a conductive adhesive such as solder or a conductive epoxy, thereby realizing package 38 as illustrated in FIG. 5.

In one preferred embodiment, conductive epoxy is used for the connection of IC 58 and device 52. Specifically, conductive epoxy is deposited on web 42, and on I/O pads, device 52 and IC 58 are placed on the conductive epoxy deposits, and the arrangement is subject to a curing step. Optionally, a solder paste, such as the solder paste disclosed in U.S. patent application Ser. No. 10/970,165, is then deposited onto source electrode 20 and gate electrode 22 of device 52, and also I/O terminals 60. The arrangement is then subjected to a reflow heating step followed by a cleaning step. With or without the solder paste, optionally, IC 58 may be then underfilled using a volatile free organopolysiloxane, and the whole assembly (except for rails 46, 48, I/O terminals 60, source electrode 20, and gate electrode 22) is covered with an organopolysiloxane. The assembly is then subjected to an appropriate curing step. As a result, IC 58 can be electrically connected to device 52 through conductive tracks on a circuit board, once package 38 is assembled in place.

Although the present invention has been described in relation to particular embodiments thereof, many other variations and modifications and other uses will become apparent to those skilled in the art.

What is claimed is:

1. A process for fabricating a semiconductor package comprising:
    depositing a dielectric body directly over a portion of an interior surface of a conductive clip having at least one side rail;
    forming at least one I/O lead over said dielectric body, said I/O lead including a conductive pad portion, an I/O terminal, and a track connecting said conductive pad to said I/O terminal;
    connecting an electrode of an IC to said conductive pad portion;
    electrically and mechanically connecting a power electrode of a power semiconductor device to said interior surface of said conductive clip wherein said I/O terminal is coplanar with said side rail.

2. The process of claim 1, wherein said dielectric body is drop-on-demand deposited.

3. The process of claim 1, wherein said I/O lead is drop-on-demand deposited.

4. The process of claim 1, further comprising depositing a solder resist over at least a portion of said terminal.

5. The process of claim 4, wherein said solder resist is drop-on-demand deposited.

6. The process of claim 1, wherein said power semiconductor device is a power MOSFET.

7. The process of claim 1, wherein said power semiconductor device is an IGBT.

8. The process of claim 1, wherein said IC includes a driver circuit for driving said power semiconductor device.

9. The process of claim 1, wherein said conductive clip is can-shaped.

10. The process of claim 1, wherein said conductive clip is comprised of copper.

11. The process of claim 1, wherein said conductive clip is plated with either gold or silver.

12. The process of claim 1, wherein said dielectric body is comprised of a polymer.

* * * * *